United States Patent [19]

Wallace

[11] 4,151,488

[45] Apr. 24, 1979

[54] PULSED POWER SUPPLY

[75] Inventor: Ronald M. Wallace, Braintree, Mass.

[73] Assignee: Raytheon Company, Lexington, Mass.

[21] Appl. No.: 880,264

[22] Filed: Feb. 22, 1978

[51] Int. Cl.$^2$ ............................................. H03B 7/06
[52] U.S. Cl. .................................. 331/107 R; 331/55
[58] Field of Search ................. 331/107 R, 107 G, 55; 307/307, 318, 296 A, 292

[56] References Cited

U.S. PATENT DOCUMENTS

| 3,339,157 | 8/1967 | Florino | 331/55 |
| 3,448,302 | 6/1969 | Shanefield | 307/318 |
| 3,621,302 | 11/1971 | Pricer | 307/296 A |

Primary Examiner—John Kominski
Attorney, Agent, or Firm—Philip J. McFarland; Joseph D. Pannone

[57] ABSTRACT

An improved pulsed power supply for a solid state diode oscillator is shown. In the preferred embodiment a voltage equal to the threshold voltage of a negative resistance diode oscillator is applied continuously through an appropriately sized resistor and at least one normally nonconducting transistor is connected in parallel with such resistor, the transistor being arranged to be turned to its conducting state when a driver produces a control pulse, thereby to cause the negative resistance diode oscillator to oscillate.

1 Claim, 1 Drawing Figure

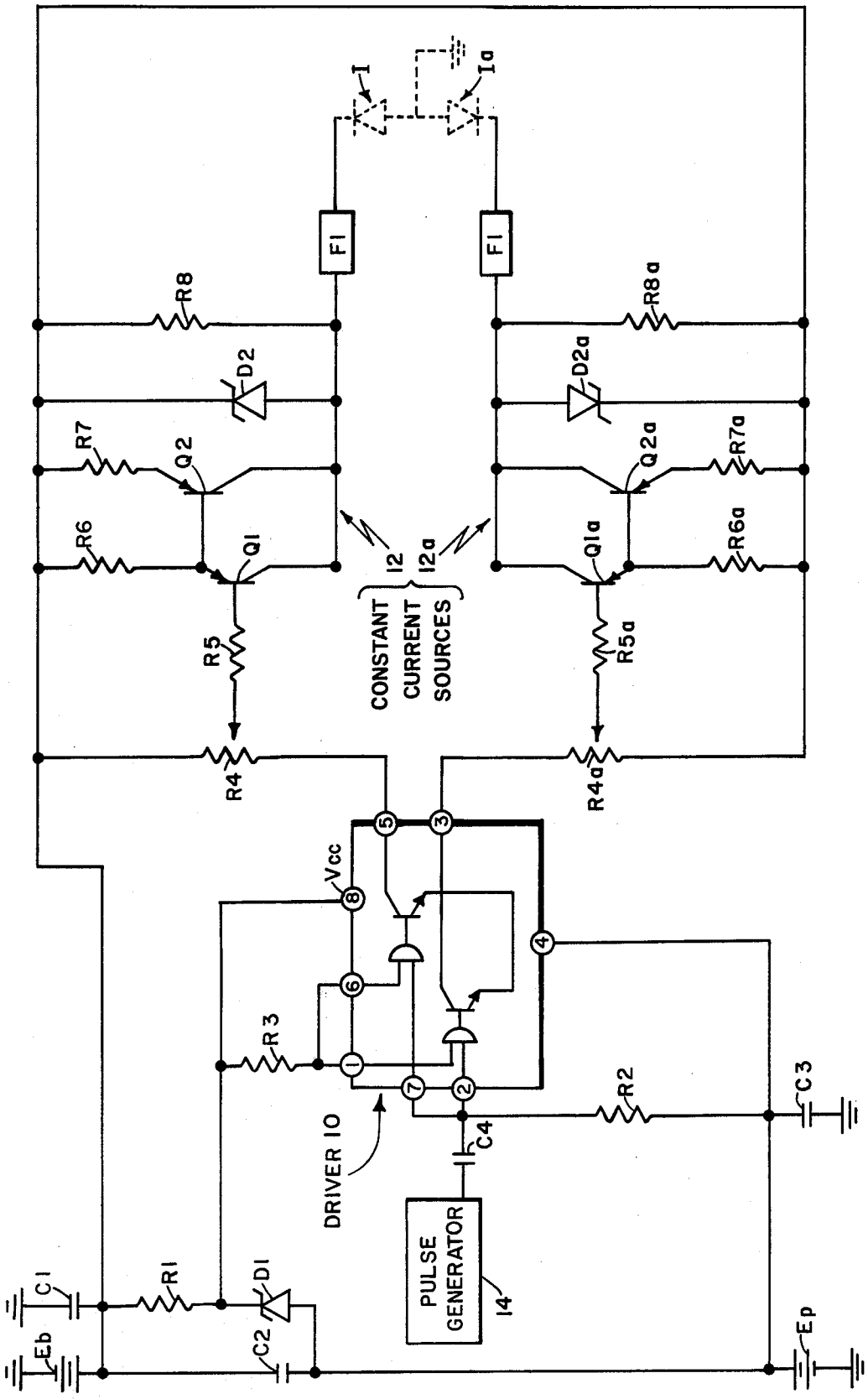

1

PULSED POWER SUPPLY

BACKGROUND OF THE INVENTION

This invention pertains generally to electronic power supplies and particularly to constant current supplies for solid state diode oscillators.

It is known in the art that a so-called IMPATT diode may be actuated to produce pulses of radio frequency energy by providing a modulator which operates to apply an appropriate D.C. current pule to such a diode whenever a pulse of radio frequency energy is required and which maintains such a diode in a standby condition during each interpulse interval. An example of the required type of modulator is shown and described in my copending U.S. application, Ser. No. 814,744, filed June 30, 1977, entitled "Solid State Power Combiner" and assigned to the same assignee as this application.

While the modulator just referred to has proven to be eminently satisfactory in practice, the physical size and weight of the elements in that modulator militate against its use in applications where the smallest and lightest possible modulators are required. For example, where a relatively large number of IMPATT diodes are to be used to form a source of radar signals for a missile-borne transmitter in an active guidance system, the physical size and weight of each one of the required modulators must be reduced to a minimum.

In addition to the foregoing, it is manifest that the efficiency of any modulator is of primary concern when it is to be used as a component in an assembly such as a missile-borne transmitter. In the referenced modulator, however, the inherent losses in the transformers (used to isolate parts of the requisite circuitry) place a relatively low ceiling on the maximum efficiency of such modulator.

SUMMARY OF THE INVENTION

With the foregoing in mind, it is a primary object of this invention to provide an improved modulator for pulsing an IMPATT diode (or any other type of negative resistance diode oscillator), which modulator has a relatively small physical size and weight.

Another object of this invention is to provide an improved modulator as above, which modulator operates at a relatively high level of efficiency.

The foregoing and other objects of this invention are attained generally by providing, in a modulator for pulsing an IMPATT diode, a driver (responsive to a control signal periodically generated to define the pulse width and repetition rate for at least one IMPATT diode) directly coupled to a corresponding constant current source for an IMPATT diode and means for maintaining a predetermined current through the IMPATT diode during each interpulse period.

BRIEF DESCRIPTION OF THE DRAWINGS

For a more complete understanding of this invention reference is now made to the following description of the accompanying drawing wherein the single FIGURE is a combined schematic and block diagram of the here contemplated modulator.

DESCRIPTION OF THE PREFERRED EMBODIMENT

Referring now to the FIGURE it will be noted that, in order to reduce the parts count of the illustrated modulator, it has been chosen to use a dual driver 10 to control operation of a pair of constant current sources 12, 12a. Thus, the dual driver 10 here is a model 75462A dual positive NAND peripheral driver manufactured by Fairchild Camera and Instrument Corporation, Mountain View, California. The generalized representation within the dual driver 10 of a NAND gate (not numbered) connected to terminals 1 and 2 to control a gating transistor (not numbered) whose collector is connected to terminal 3 illustrates the logic of one-half of the dual driver. Thus, with a voltage source Eb (here +165 volts) connected via resistors R1 and R3 to terminal 1 a positive going pulse from a pulse generator 14 causes the gating transistor to be turned on, thereby resulting in a negative going pulse at terminal 3. Similarly, the NAND gate (not numbered) connected to terminals 6 and 7 and controlling the gating transistor (not numbered) connected to terminal 5 are operative in response to a positive pulse from the pulse generator 14 to produce a negative going pulse at terminal 5. The proper biases for the dual driver 10 are attained by: (a) connecting, via resistor R1, the VCC terminal (#8) to the voltage source Eb; (b) connecting via potentiometers 4, 4a, respectively, terminals 5 and 3 to the voltage source Eb; (c) connecting the "ground" terminal (terminal 4) to a voltage source Ep (here +156 volts); and (d) connecting, via a resistor R2, the terminals 2, 7 to the voltage source Ep. To maintain the proper value of VCC, a Zener diode D1 is connected as shown between the voltage source Ep and terminal 8. Finally, to complete the description of the way in which the dual driver 10 is actuated, capacitor C4 and filter capacitors C1, C2 and C3 are connected as shown.

The constant current sources 12, 12a are the same, so only one (constant current source 12a) will be described. Thus, the tap of the potentiometer 4a is connected through a resistor 5a to the base of a transistor Q1a. The emitter of transistor Q1a is connected via a resistor 6a to the voltage source Eb and also to the base of a transistor Q2a. The emitter of the transistor Q2a is connected to the voltage source Eb. The collectors of transistors Q1a, Q2b are connected through a fuse F1a to (as shown in dotted line) an IMPATT diode Ia. It will be appreciated now that: (a) without a negative going pulse at terminal 3 the bias across the transistor Q1a to maintain that transistor in its "OFF" condition is independent of the position of the tap on potentiometer R4a; (b) the condition of transistor Q2a follows the condition of transistor Q1a; and (c) with a negative going pulse at terminal 3, the magnitude of the pulse appearing on the base of the transistor Q1a (to drive that transistor into its "ON" condition) is dependent upon the position of the tap on the potentiometer R4A. In operation, then, the transistors Q1a, Q2a connected in the circuit described above are caused to conduct whenever a positive going pulse is produced by the pulse generator 14, thereby completing parallel paths for current from the voltage source Eb to the IMPATT diode Ia. It will be appreciated that the amount of current through the transistors Q1a, Q1b is dependent upon the drive current caused by the positive going pulse. It will be noted that the use of two transistors permits each to have a lower current rating and that, if desired, more than two transistors could be used.

During each interpulse period, i.e. when each of the transistors Q1a is in its "OFF" condition, it is necessary to maintain a so-called thereshold current through the IMPATT diode Ia. The threshold current, which differs for different types of IMPATT diodes, is the maximum current through an IMPATT diode to maintain the temperature of the junction as close as practical to the temperature it attains when oscillations are being generated. The proper threshold current through the IMPATT diode Ia during each interpulse period here is accomplished by completing a D.C. path between the voltage source Eb and the IMPATT diode Ia through a resistor 8a connected as shown. It will be appreciated that for a given IMPATT diode the ratio between the current flowing through such device when oscillating and the threshold current is in the order of 500 to 1. Therefore, the resistance of the dropping resistor R8a is in the order of 500 times the equivalent resistance of the resistors R6a, R7a, the particular value of resistance being finally determined by the requirements of the IMPATT diode used. That is to say, the value of the resistor 8a ultimately is determined by the required voltage across the IMPATT diode used to maintain its thereshold current.

To complete the illustrated circuit, a Zener diode D2a, poled as shown, is connected in parallel with the dropping resistor R8a to protect the transistors Q1a, Q2a should the IMPATT diode Ia short out. In such an eventuality, the Zener diode D2a is effective to maintain a constant voltage (less than the emitter-to-collector breakdown voltage of the transistors Q1a, Q2a) until the fuse F1a blows.

Having described a preferred embodiment of this invention, it will now be apparent to one of skill in the art that changes may be made without departing from the concepts of this invention. It is felt, therefore, that this invention should not be restricted to its disclosed embodiment, but rather should be limited only by the spirit and scope of the appended claims.

What is claimed is:

1. A power supply for a solid state diode oscillator comprising:
    (a) means, including a dropping resistor connected between a first electrical power source and a solid state diode oscillator, for maintaining a voltage across such diode equal to the threshold voltage therefor;
    (b) means, including a normally nonconducting transistor, connected in parallel with the dropping resistor for effectively shorting out such resistor whenever the normally nonconducting transistor is rendered conducting;
    (c) a pulse generator for periodically producing pulses when the normally nonconducting transistor is to be rendered conducting; and
    (d) logic circuitry, coupled through a capacitor to the pulse generator and coupled through resistors to a second electrical power source and to the first electrical power source, for providing a drive signal to render the normally nonconducting transistor conducting whenever a pulse is produced by the pulse generator.

* * * * *